United States Patent
Fu et al.

(10) Patent No.: US 9,627,475 B2
(45) Date of Patent: Apr. 18, 2017

(54) DUMMY GATE STRUCTURE FOR SEMICONDUCTOR DEVICES

(71) Applicant: Taiwan Semiconductor Manufacturing Company, Ltd., Hsin-Chu (TW)

(72) Inventors: Shih-Chi Fu, Zhudong Township (TW); Chien-Chih Chou, New Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/853,565

(22) Filed: Sep. 14, 2015

(65) Prior Publication Data

US 2016/0005814 A1    Jan. 7, 2016

Related U.S. Application Data

(62) Division of application No. 13/345,059, filed on Jan. 6, 2012, now Pat. No. 9,136,349.

(51) Int. Cl.
| | |
|---|---|
| *H01L 21/70* | (2006.01) |
| *H01L 29/06* | (2006.01) |
| *H01L 29/66* | (2006.01) |
| *H01L 21/8234* | (2006.01) |
| *H01L 27/02* | (2006.01) |
| *H01L 21/762* | (2006.01) |

(52) U.S. Cl.
CPC .... *H01L 29/0649* (2013.01); *H01L 21/76229* (2013.01); *H01L 21/823456* (2013.01); *H01L 21/823462* (2013.01); *H01L 27/0207* (2013.01); *H01L 29/66606* (2013.01)

(58) Field of Classification Search
CPC ......... H01L 29/66606; H01L 29/66871; H01L 29/66545
See application file for complete search history.

(56) References Cited

U.S. PATENT DOCUMENTS

| | | | |
|---|---|---|---|
| 6,163,356 A | 12/2000 | Song et al. | |
| 2008/0073746 A1* | 3/2008 | Tanaka | H01L 21/32 257/510 |
| 2011/0193151 A1 | 8/2011 | Sakamoto | |

* cited by examiner

*Primary Examiner* — Elias M Ullah
(74) *Attorney, Agent, or Firm* — Slater Matsil, LLP

(57) ABSTRACT

A structure and method for fabricating a spacer structure for semiconductor devices, such as a multi-gate structure, is provided. The dummy gate structure is formed by depositing a dielectric layer, forming a mask over the dielectric layer, and patterning the dielectric layer. The mask is formed to have a tapered edge. In an embodiment, the tapered edge is formed in a post-patterning process, such as a baking process. In another embodiment, a relatively thick mask layer is utilized such that during patterning a tapered results. The profile of the tapered mask is transferred to the dielectric layer, thereby providing a tapered edge on the dielectric layer.

20 Claims, 8 Drawing Sheets

US 9,627,475 B2

DUMMY GATE STRUCTURE FOR SEMICONDUCTOR DEVICES

This application is a divisional application of, and claims priority to, U.S. patent application Ser. No. 13/345,059, entitled "Dummy Gate Structure for Semiconductor Devices," filed on Jan. 6, 2012, which application is incorporated herein by reference

BACKGROUND

Size reduction of complementary metal-oxide-semiconductor (CMOS) devices, such as transistors, has enabled the continued improvement in speed, performance, density, and cost per unit function of integrated circuits over the past few decades. As sizes are reduced, there has been a trend to integrate more functions on a single chip, some of which require higher voltage levels.

In these situations, it is common for a single die to include transistors having different gate structures. For example, low-voltage devices are typically formed using a relatively thin gate oxide layer, while high-voltage devices are typically formed using a relatively thick gate oxide layer. These embodiments may have an edge where the thicker oxide layer terminates.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The following description is described in the context of forming a dummy gate in a buffer area between a low-voltage region and a high voltage region, e.g., along an edge of a high voltage gate oxide. The processes and structures described herein, such as the forming and the using of a tapered mask layer to pattern an underlying layer having a tapered edge, however, may be used in other embodiments.

Figure 1:
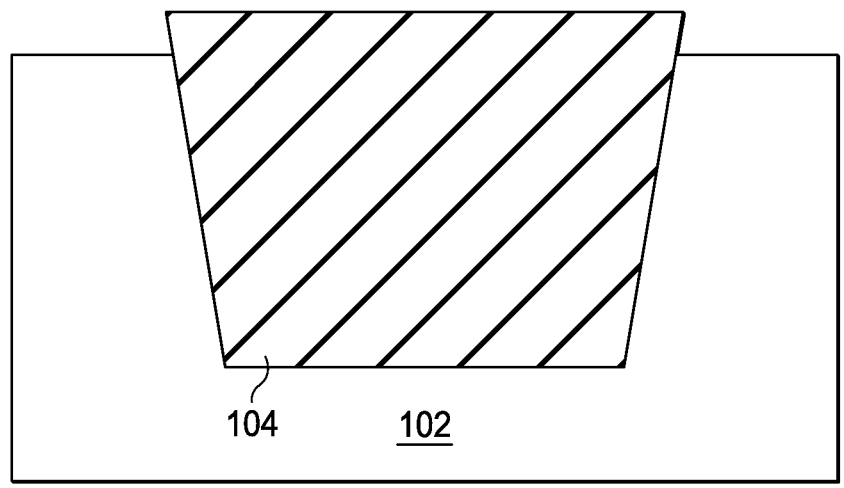
FIGS. 1-5 illustrate cross-sectional views of various intermediate process steps in accordance with a first embodiment.

Referring now to FIG. 1, a substrate 102 having an isolation region 104 formed therein is illustrated. The substrate 102 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate may also be used.

The isolation region, such as shallow trench isolation (STI) 104, or other isolation structures, may be formed in substrate 102 to isolate device regions. STI 104 may be formed by etching substrate 102 using photolithography techniques to form recesses. Generally, photolithography involves depositing a photoresist material, which is then masked, exposed, and developed. After the photoresist mask is patterned, an etching process may be performed to remove unwanted portions of the substrate 102 as illustrated in FIG. 1. In an embodiment in which the substrate 102 comprises bulk silicon, the etching process may be a wet or dry, anisotropic or isotropic, etch process. The recesses are then filled with a dielectric material such as an oxide layer formed by any oxidation process, such as wet or dry thermal oxidation in an ambient comprising an oxide, H2O, NO, or a combination thereof, or by chemical vapor deposition (CVD) techniques using tetra-ethyl-ortho-silicate (TEOS) and oxygen as a precursor.

Figure 2:
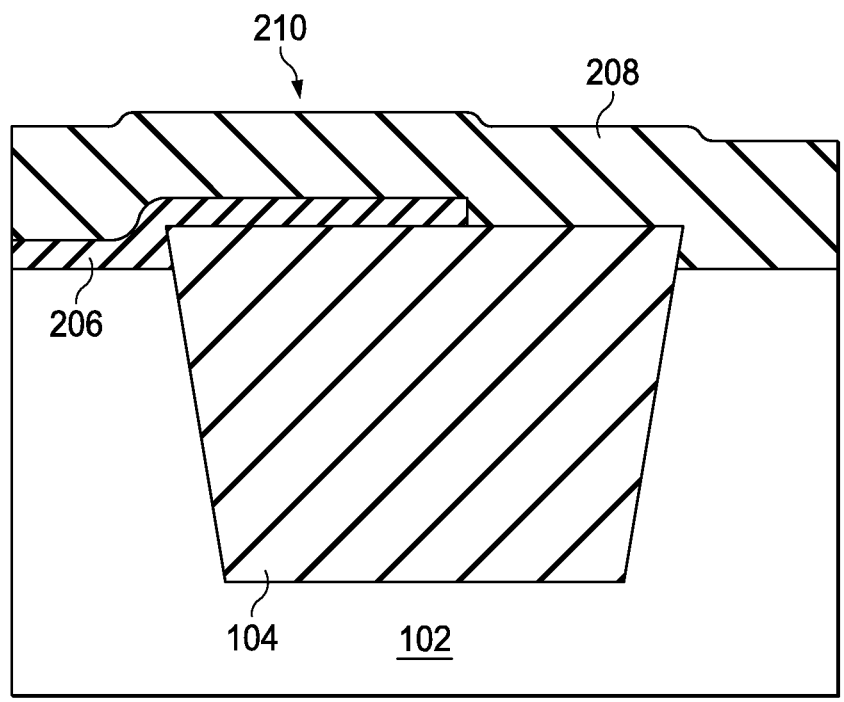

FIG. 2 illustrates formation of an etch stop layer (ESL) 206 over the STI 104 in accordance with an embodiment. The ESL 206 provides protection to the underlying layer, such as the STI 104, during later processing, such as patterning a gate oxide layer as discussed in greater detail below. The ESL 206 may be formed by, for example, depositing a conformal layer and patterning using photolithography techniques. In this embodiment in which the STI 104 is formed of a oxide, the ESL 206 may be formed of, for example, SiN, or the like, using CVD, atomic layer deposition (ALD), physical vapor deposition (PVD), or the like techniques and patterned using photolithography techniques. The ESL 206 may have a thickness of about 100 Å to about 300 Å. Other materials, processes, and thicknesses may be used.

FIG. 2 also illustrates forming a dielectric layer 208 in accordance with an embodiment of the present invention. The dielectric layer 208 comprises a dielectric material, such as silicon dioxide, silicon oxynitride, silicon nitride, a nitrogen-containing oxide, a combination thereof, or other dielectric material. A silicon dioxide dielectric layer may be formed, for example, by an oxidation process, such as wet or dry thermal oxidation.

In an embodiment, the dielectric layer 208 forms a gate oxide for, e.g., a high-voltage transistor (not shown). In this embodiment the dielectric layer 208 may have a thickness from about 500 Å to about 2,000 Å. Other processes, materials, and thicknesses may be used.

As shown in FIG. 2, a peak 210 may be formed along the upper surface of the dielectric layer 208. The peak 210 may be caused by the change in the topography of the underlying layers. For example, in the embodiment illustrated in FIG. 2, the ESL 206 is formed over the STI 104, causing a region of higher topography. As a result, when the dielectric layer 208 is formed over the ESL 206, the change in topography between the STI 104/substrate 102 and the ESL 206, a portion of the dielectric layer 208 extends higher than surrounding regions.

Figure 3:
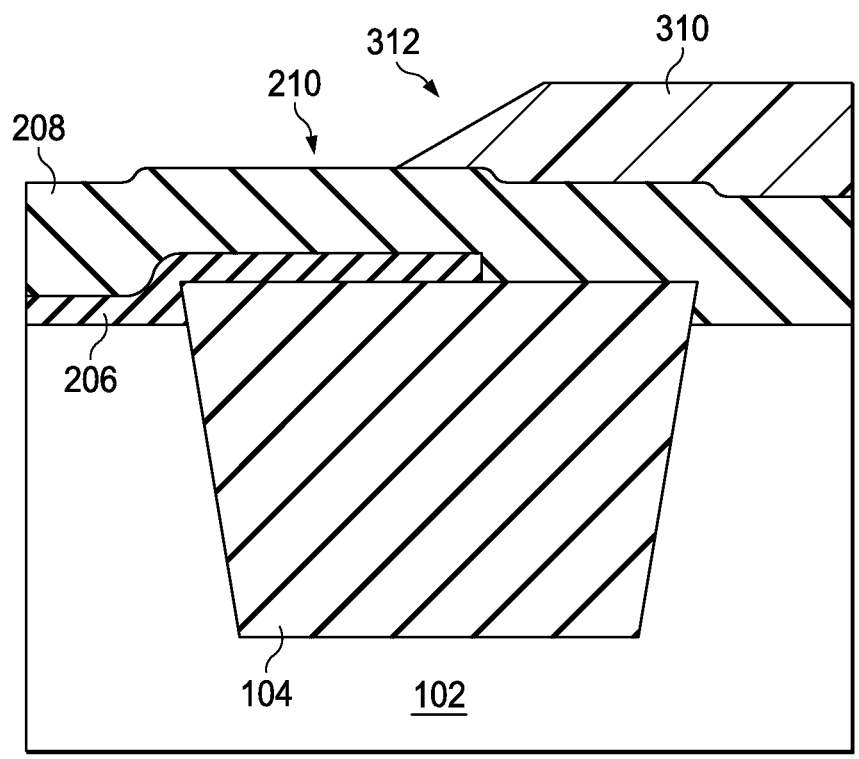

FIG. 3 illustrates the substrate 102 after a tapered mask 310 has been deposited and patterned in accordance with an embodiment. Generally, as discussed in greater detail below, the tapered mask 310 provides a mask for patterning the dielectric layer 208 to form a gate dielectric layer in later processing steps. In an embodiment, the patterned mask comprises a photoresist material exposed and developed.

FIG. 3 also illustrates a tapered edge 312 to the tapered mask 310. In an embodiment, the tapered edge 312 may be formed by performing a post-patterning process. For example, in an embodiment in which the tapered mask 310 comprises a photoresist material, the photoresist material may be deposited, exposed, and developed. Thereafter, the patterned photoresist may be subjected to a thermal process. A thermal process, such as a baking procedure, may cause the patterned photoresist material to flow, thereby tapering the sidewalls of the patterned photoresist and forming a tapered mask similar to that illustrated in FIG. 3. In an embodiment, the baking process may be performed at a temperature greater than the glass transition temperature (Tg) of the photoresist material. For example, in an embodiment in which the photoresist comprises diazonaphthoquinone-novolac resin provided by ShinEtsu, which has a Tg of about 115° C., the baking process may be performed at a temperature of about 120° C. to about 160° C.

In another embodiment, the tapered edge 312 may be formed as the result of the photoresist exposure and developing step of a relatively thick photoresist layer. It has been found that when a thick photoresist layer, such as a photoresist layer having a thickness of about 15,000 Å, the exposure and developing processes result in a tapered sidewall, similar to that illustrated in FIG. 3.

Figure 4:
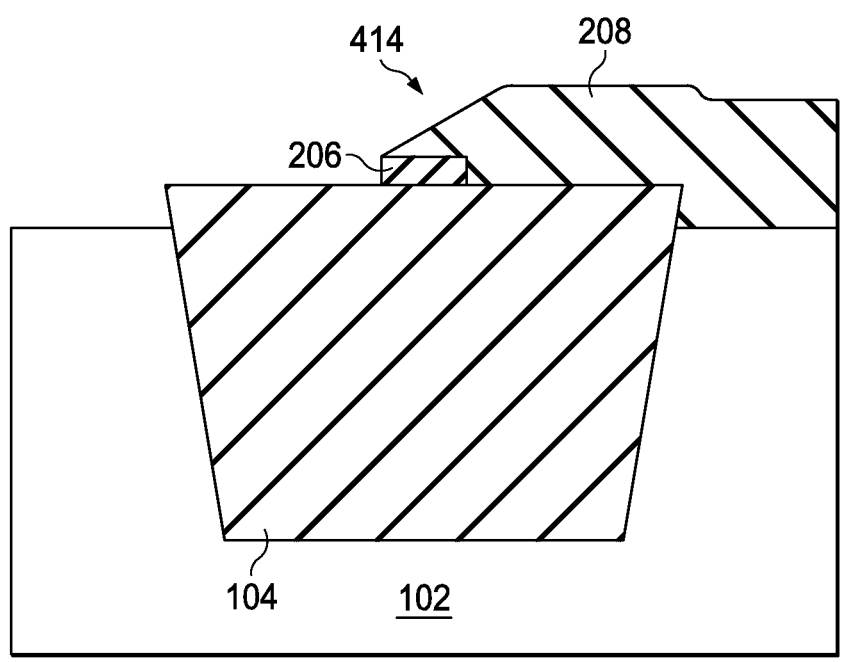

FIG. 4 illustrates the dielectric layer 208 after patterning in accordance with an embodiment. The dielectric layer 208 may be patterned for example, using the tapered mask 310 as an etch mask. As a result of the tapered edge 312 of the tapered mask 310, the dielectric layer 208 exhibits a tapered sidewall 414 as well. Further, because the sidewalls are tapered, the peak 210 of the dielectric layer 208 (see FIG. 2) is reduced and/or removed. Because of the tapered edge 312 of the tapered mask 310 (and hence the tapered edge of the dielectric layer 208), the raised portion is reduced and/or removed, and a subsequently formed conductive layer (e.g., a polysilicon layer) will not be raised as well. In this manner, a greater separation is maintained between the subsequently formed conductive layer and overlying metallization layers (e.g., metallization layer M1). In an embodiment in which the dielectric layer 208 comprises a silicon dioxide material, the dielectric layer 208 may be etched using a wet etch process with diluted hydrofluoric acid.

FIG. 4 also illustrates a removal of the excess material of the ESL 206. In an embodiment in which the ESL 206 is formed of SiN, the removal process may comprise wet etch process using phosphoric acid, which allows the SiN ESL 206 to be removed without causing significant damage to the STI 104 or the dielectric layer 208.

Figure 5:
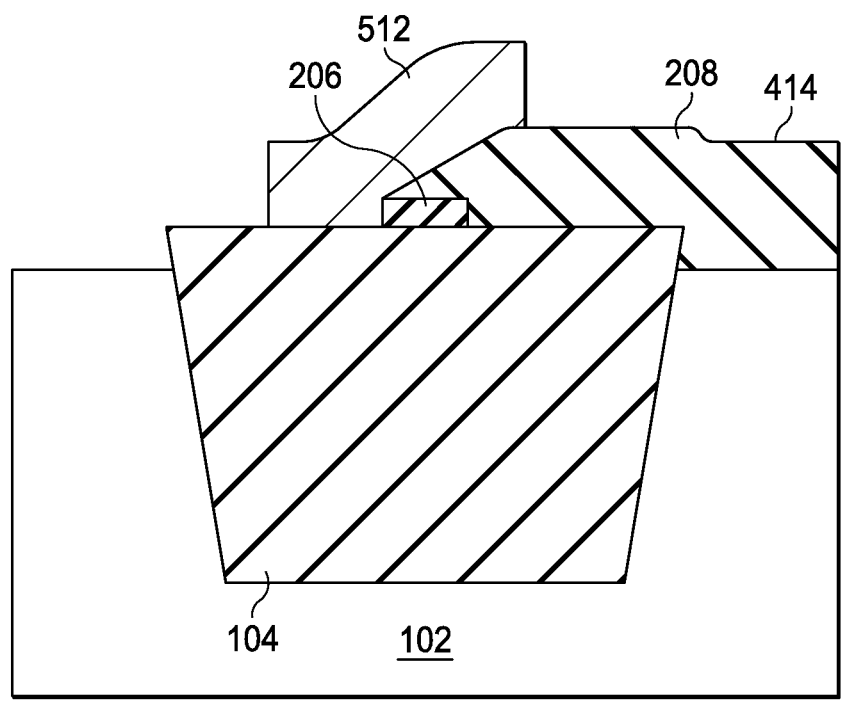

Referring now to FIG. 5, there is shown a conductive layer 512 formed and patterned over the dielectric layer 208 in accordance with an embodiment. The conductive layer 512 may comprise, e.g., a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, a combination thereof, or the like. In one example, amorphous silicon is deposited and re-crystallized to create poly-crystalline silicon (polysilicon). The polysilicon layer may be formed by depositing doped or undoped polysilicon by low-pressure chemical vapor deposition (LPCVD) to a thickness in the range of about 1,000 Å to about 1,500 Å. Other materials, processes, and thicknesses may be used.

In another embodiment, the conductive layer 512 is a multi-layer structure. For example, in an embodiment, the conductive layer 512 comprises a polysilicon layer with an overlying tungsten silicide layer. In this embodiment, the tungsten silicide layer may provide a lower contact resistance and better adhesive properties with an overlying via (not shown).

Figure 6:
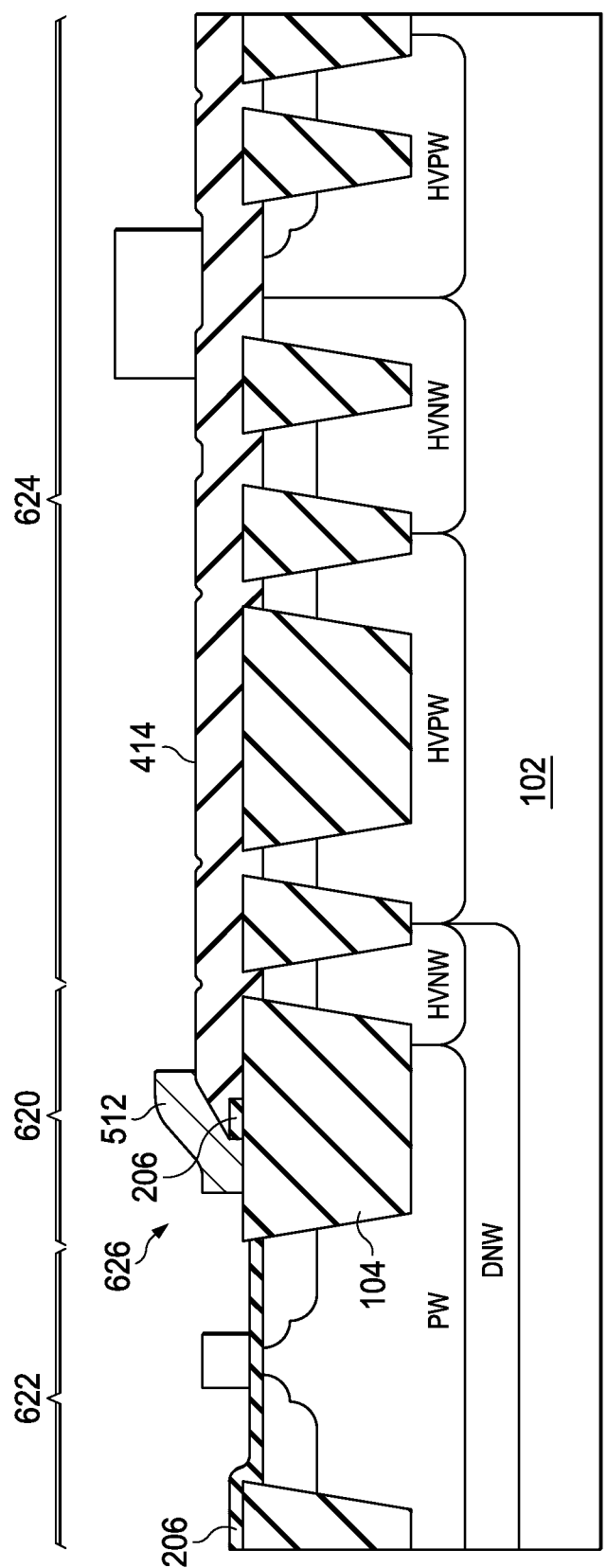
FIG. 6 illustrates a structure utilizing an embodiment such as that illustrated in FIGS. 1-5.

In an embodiment, the above process may be utilized to form a dummy gate. For example, FIG. 6 illustrates an embodiment in which the above process is used to form a dummy gate in a boundary region 620 between a low voltage region 622 and a high voltage region 624. For example, as illustrated in FIG. 6, the high voltage region 624 utilizes a thicker gate oxide than the low voltage region 622. The use of the process discussed above reduces the overall height of the dummy gate 626. It is believed the dummy pattern may decrease the possibility of defects from boundary region. For example, some poly residue after poly-gate patterning in the side-wall of boundary may fall off in subsequent process.

The components illustrated in FIG. 6 for the low voltage region 622 and the high voltage region 624 are provided for illustrative purposes only to better illustrate an embodiment. Other embodiments may include other structures.

Figure 7:
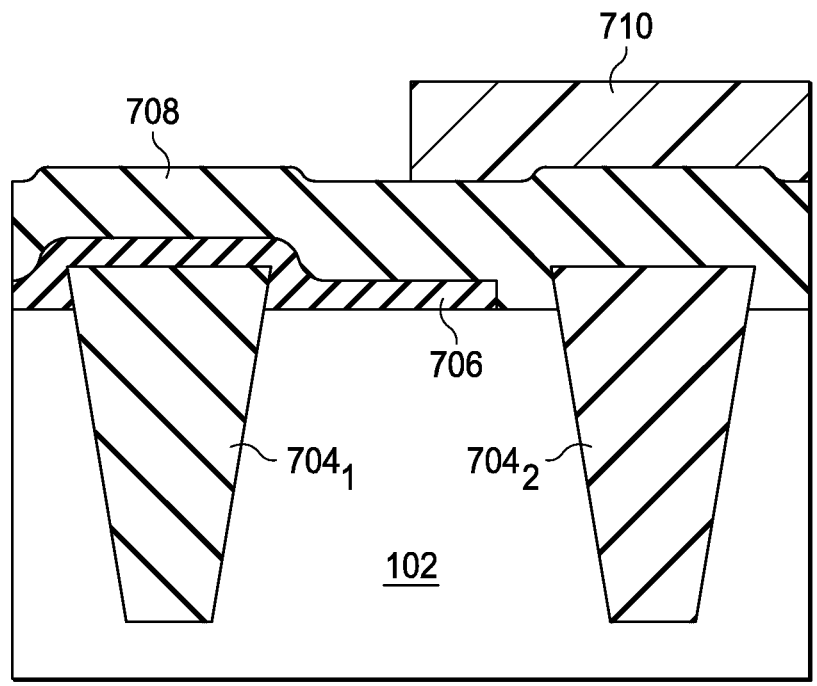
FIGS. 7 and 8 illustrate cross-sectional views of various intermediate process steps in accordance with a second embodiment.
Figure 8:
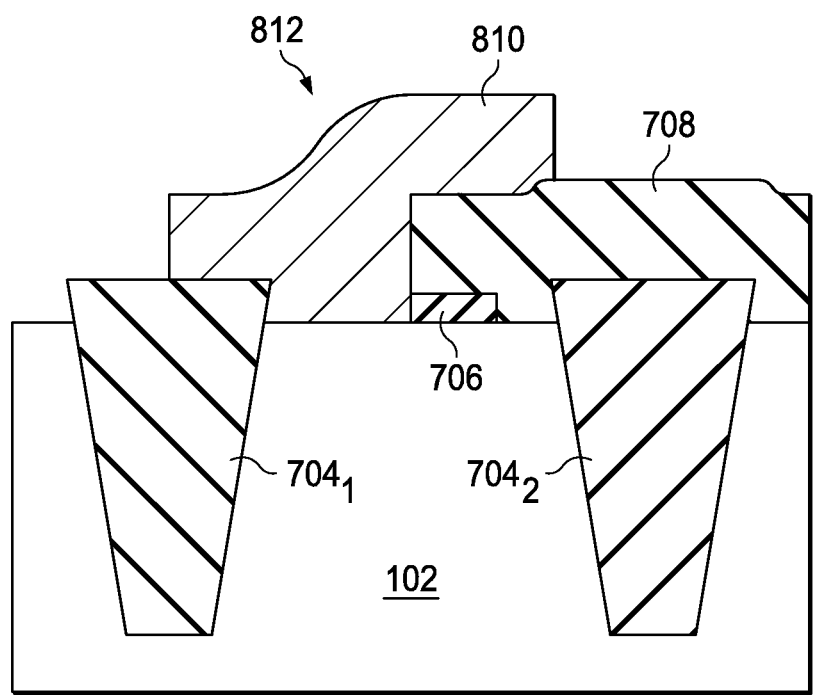

FIGS. 7 and 8 illustrate another embodiment in which a dummy gate is formed between STIs. Referring first to FIG. 7, there is shown the substrate 102 having a first STI $704_1$ and a second STI $704_2$ formed therein. ESL 706 is formed along a surface of the substrate 102 between the first STI $704_1$ and the second STI $704_2$. In this embodiment, the first STI $704_1$ and a second STI $704_2$ may extend above the substrate 102 by about 200 Å to about 800 Å, and the ESL 706 may have a thickness of about 100 Å to about 300 Å.

FIG. 7 further illustrates formation of a dielectric layer 708. Because the ESL 706 is formed between the first STI $704_1$ and a second STI $704_2$, an overall height above the substrate 102 of the dielectric layer 708 over the ESL 706 is reduced and/or eliminated. For example, as illustrated in FIG. 7, the peak 210 of FIG. 2 is reduced and/or eliminated.

Similar processes and materials may be used to form the ESL 706 and the dielectric layer 708 as discussed above with reference to the ESL 206 and the dielectric layer 208, respectively.

A patterned mask 710 is formed over the dielectric layer 708. The dielectric layer 708 may be formed with similar materials and processes as the dielectric layer 208 discussed above with reference to FIG. 2. As noted above, the peak 210 of the dielectric layer 208 illustrated in FIG. 2 is reduced or eliminated in this embodiment. As a result, an overall height above the substrate 102 of an overlying conductive layer that is subsequently formed (e.g., an overlying conductive layer) as discussed below is reduced, thereby reducing the risk of the conductive layer from contacting overlying metallization layers.

In an embodiment, processing to form a tapered mask, e.g., tapered mask 310 (see FIG. 3), may be omitted. For example, a thick photoresist layer and/or the baking procedure after patterning may not be necessary in order to form the tapered edge 312 for the tapered mask 310 to reduce the peak 210. Thus, in this embodiment, the patterned mask 710 may have more vertical sidewalls than those of the tapered mask 310 of FIG. 3.

FIG. 8 illustrates the dielectric layer 208 after patterning and the removal of excess material of the ESL 706 in accordance with an embodiment. The dielectric layer 208 may be patterned and the excess ESL 706 may be removed using similar processes as discussed above.

FIG. 8 further illustrates a conductive layer 810 formed and patterned over the dielectric layer 208 in accordance with an embodiment, thereby forming a dummy gate electrode 812. The conductive layer 810 may be formed of similar materials and using similar processes as those discussed above with reference to the conductive layer 512 illustrated in FIG. 5.

Figure 9:
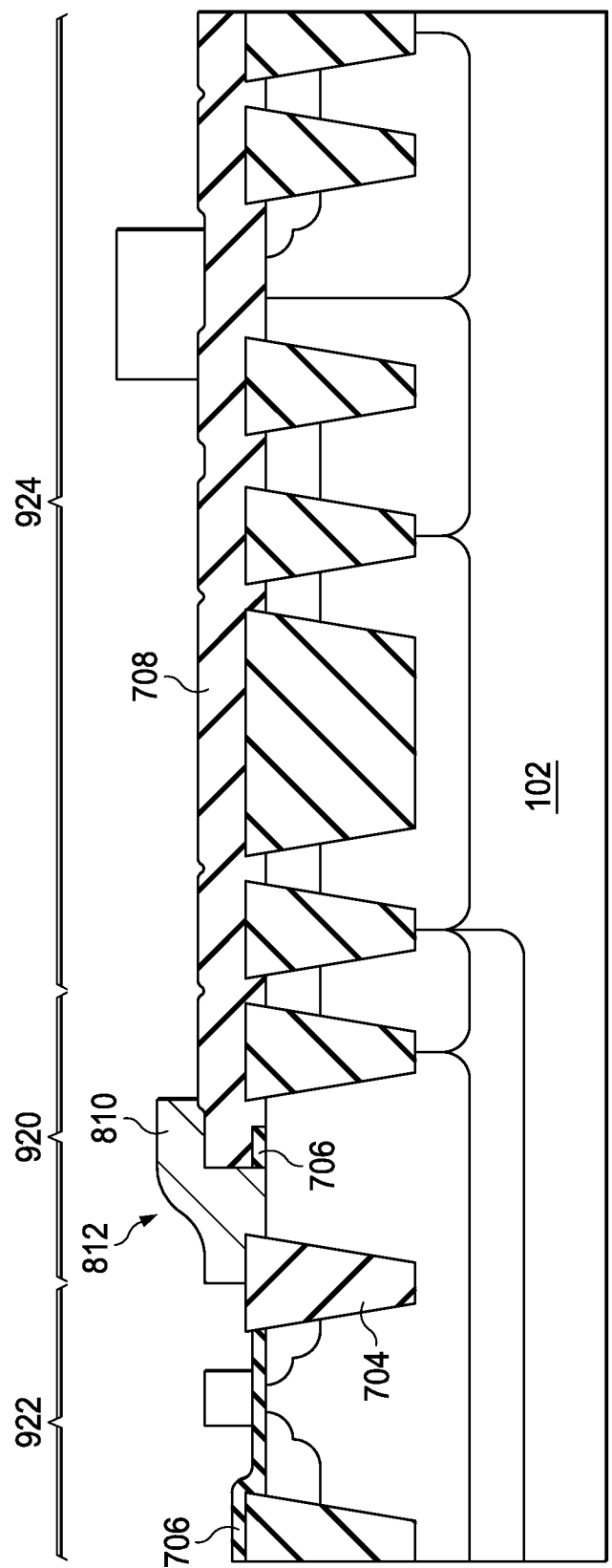
FIG. 9 illustrates a structure utilizing an embodiment such as that illustrated in FIGS. 7 and 8.

FIG. 9 illustrates an embodiment incorporating the process discussed above with reference to FIGS. 7 and 8. For example, FIG. 9 illustrates an embodiment in which the above process is used to form a dummy gate in a boundary region 920 between a low voltage region 922 and a high voltage region 924. For example, as illustrated in FIG. 9, the high voltage region 924 utilizes a thicker gate oxide than the low voltage region 922. The use of the process discussed above reduces the overall height of the dummy gate 812.

The components illustrated in FIG. 9 for the low voltage region 922 and the high voltage region 924 are provided for illustrative purposes only to better illustrate an embodiment. Other embodiments may include other structures.

Figure 10:
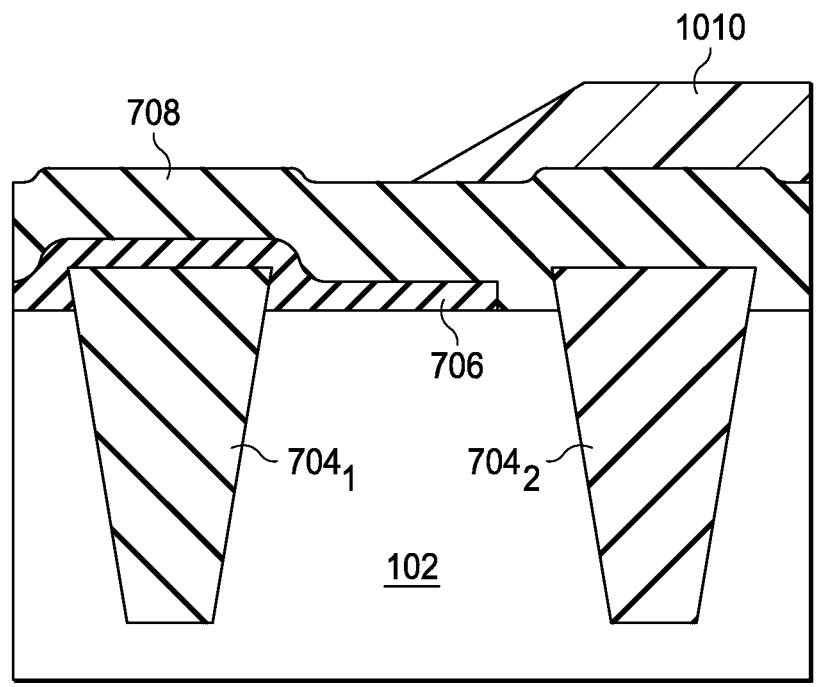
FIGS. 10 and 11 illustrate cross-sectional views of various intermediate process steps in accordance with a third embodiment.
Figure 11:
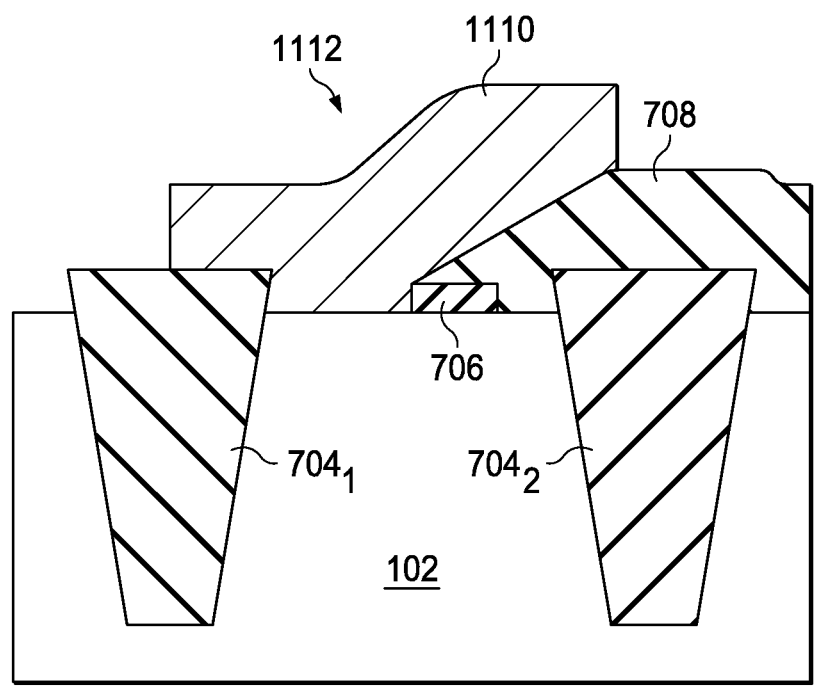

FIGS. 10 and 11 illustrate another embodiment that combines elements of the embodiments illustrated in FIGS. 1-6 and FIGS. 7-9 such that the dummy gate is formed between STIs as in the embodiment of FIGS. 7-9 and a tapered mask is used as in the embodiment of FIGS. 1-6. Accordingly, FIG. 10 illustrates the embodiment illustrated in FIG. 7, except that the patterned mask 710 of FIG. 7 is replaced with a tapered mask 1010, which may be formed using similar materials and processes as discussed above with reference to the tapered mask 310 of FIG. 3.

FIG. 11 illustrates the resulting structure after the dielectric layer 708 is patterned, excess material of the ESL 706 is removed, and a patterned conductive layer 1110 is formed, thereby forming dummy gate 1112. Similar materials and similar processes as those discussed above may be used.

Figure 12:
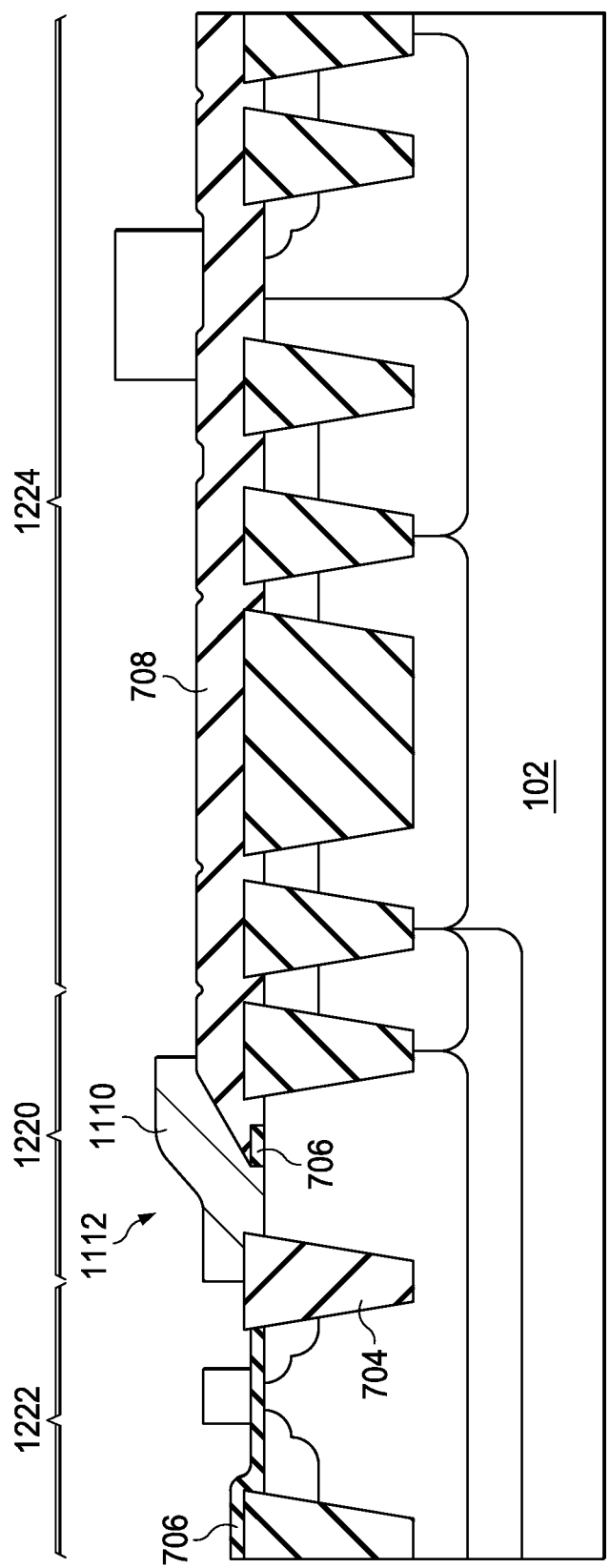
FIG. 12 illustrates a structure utilizing an embodiment such as that illustrated in FIGS. 10 and 11.

FIG. 12 illustrates an embodiment incorporating the process discussed above with reference to FIGS. 10 and 11. For example, FIG. 12 illustrates an embodiment in which the above process is used to form a dummy gate in a boundary region 1220 between a low voltage region 1222 and a high voltage region 1224. For example, as illustrated in FIG. 12, the high voltage region 1224 utilizes a thicker gate oxide than the low voltage region 1222. The use of the process discussed above reduces the overall height of the dummy gate 1112.

The components illustrated in FIG. 12 for the low voltage region 1222 and the high voltage region 1224 are provided for illustrative purposes only to better illustrate an embodiment. Other embodiments may include other structures.

In an embodiment, a method is provided. The method comprises forming a first dielectric layer over a substrate; forming a second dielectric layer over the first dielectric layer; forming a tapered mask over the second dielectric layer, the tapered mask having a tapered edge; and patterning the second dielectric layer such that a profile of the tapered edge of the tapered mask is transferred to the second dielectric layer.

In another embodiment, a semiconductor device is provided. The semiconductor device comprises a first dielectric layer over a substrate; a second dielectric layer over the first dielectric layer, lateral edges of the first dielectric layer and the second dielectric layer being coterminous; and a conductive layer overlapping a lateral edge of the second dielectric layer, the conductive layer having an upper surface extending in a first lateral direction such that height of the upper surface does not decrease, the conductive layer being electrically inactive.

In yet another embodiment, a semiconductor device is provided. The semiconductor device comprises a second dielectric layer over a first dielectric layer, a first lateral edge of the first dielectric layer being coterminous with a second lateral edge of the second dielectric layer, a second lateral edge of the second dielectric layer extending further than a second lateral edge of the first dielectric layer, the first lateral edge of the second dielectric layer being slanted; and a conductive layer overlapping the first lateral edge of the first dielectric layer and first lateral edge of the second dielectric layer.

In yet another embodiment, a semiconductor device is provided. The semiconductor device includes a second dielectric layer over a first dielectric layer, a first lateral edge of the first dielectric layer being coterminous with a first lateral edge of the second dielectric layer, the second dielectric layer extending over a second lateral edge of the first dielectric layer, the first lateral edge of the second dielectric layer being slanted. A conductive layer overlaps the first lateral edge of the first dielectric layer and the first lateral edge of the second dielectric layer.

In yet another embodiment, a semiconductor device is provided. The semiconductor device includes a first dielectric layer over a substrate, and a second dielectric layer over the first dielectric layer, a first lateral edge of the first dielectric layer and being coterminous with a first lateral edge of the second dielectric layer. A conductive layer overlaps the first lateral edge of the first dielectric layer and the first lateral edge of the second dielectric layer, the conductive layer having a first lateral edge over the second dielectric layer, the first lateral edge of the conductive layer having a first height above the substrate, the first height being a maximum height above the substrate for the conductive layer.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
    a first dielectric layer over a substrate;
    a second dielectric layer extending over an uppermost surface of the first dielectric layer, the uppermost surface being most distal from the substrate, lateral edges of the first dielectric layer and the second dielectric layer being coterminous; and
    a conductive layer overlapping a lateral edge of the second dielectric layer, the conductive layer having an upper surface extending in a first lateral direction from the lateral edge of the second dielectric layer to over the second dielectric layer such that a height of the upper surface does not decrease, the conductive layer being electrically inactive.

2. The semiconductor device of claim 1, further comprising a first isolation region and a second isolation region, the first dielectric layer being positioned between the first isolation region and the second isolation region.

3. The semiconductor device of claim 2, wherein a thickness of the first dielectric layer is less than a distance that the first isolation region extends above an uppermost surface of the substrate.

4. The semiconductor device of claim 1, further comprising an isolation region, the first dielectric layer being positioned on the isolation region.

5. The semiconductor device of claim 1, wherein the conductive layer is position between a low-voltage region and a high-voltage region.

6. The semiconductor device of claim 1, wherein a lateral edge of the second dielectric layer has a tapered edge.

7. The semiconductor device of claim 1, wherein the conductive layer has a first lateral edge and a second lateral edge, the first lateral edge being positioned over the second dielectric layer, the second lateral edge being positioned over an isolation region in the substrate.

8. A semiconductor device comprising:
a second dielectric layer over a first dielectric layer, a first lateral edge of the first dielectric layer being coterminous with a first lateral edge of the second dielectric layer, the second dielectric layer extending continuously over an uppermost surface of the first dielectric layer from the first lateral edge of the first dielectric layer to a second lateral edge of the first dielectric layer, the first lateral edge of the second dielectric layer being slanted; and
a conductive layer overlapping the first lateral edge of the first dielectric layer and the first lateral edge of the second dielectric layer.

9. The semiconductor device of claim 8, wherein a highest surface of the conductive layer being laterally offset from the first dielectric layer.

10. The semiconductor device of claim 8, wherein the first dielectric layer is positioned over an isolation region extending into a substrate.

11. The semiconductor device of claim 8, wherein the first dielectric layer is positioned between isolation regions extending into a substrate.

12. The semiconductor device of claim 8, wherein the conductive layer has a first lateral edge positioned over a first isolation region extending into a substrate.

13. The semiconductor device of claim 12, wherein the conductive layer has a second lateral edge positioned over a second isolation region extending into the substrate.

14. The semiconductor device of claim 8, wherein the conductive layer is electrically disconnected from other circuitry.

15. A semiconductor device comprising:
a first dielectric layer over a substrate;
a second dielectric layer over the first dielectric layer, a first lateral edge of the first dielectric layer being coterminous with a first lateral edge of the second dielectric layer, the second dielectric layer extending continuously over an uppermost surface of the first dielectric layer and past a second lateral edge of the first dielectric layer; and
a conductive layer overlapping the first lateral edge of the first dielectric layer and the first lateral edge of the second dielectric layer, the conductive layer having a first lateral edge over the second dielectric layer, the first lateral edge of the conductive layer having a first height above the substrate, the first height being a maximum height above the substrate for the conductive layer.

16. The semiconductor device of claim 15, wherein the conductive layer is electrically inactive.

17. The semiconductor device of claim 15, further comprising a first trench isolation region and a second trench isolation region, the first trench isolation region and the second trench isolation region protruding from an uppermost surface of the substrate, the first dielectric layer being positioned between the first trench isolation region and the second trench isolation region.

18. The semiconductor device of claim 15, further comprising a first trench isolation region, the first lateral edge of the conductive layer being positioned above the first trench isolation region.

19. The semiconductor device of claim 18, further comprising a second trench isolation region, the conductive layer have a second lateral edge, the second lateral edge being positioned above the second trench isolation region.

20. The semiconductor device of claim 15, wherein the conductive layer comprises polysilicon.

* * * * *